(12) United States Patent
Schleuning

(10) Patent No.: US 8,160,115 B2
(45) Date of Patent: Apr. 17, 2012

(54) TWO-DIMENSIONAL DIODE-LASER ARRAY WITH BROAD-BAND OUTPUT

(75) Inventor: David Schleuning, Oakland, CA (US)

(73) Assignee: Coherent, Inc., Santa Clara, CA (US)

( * ) Notice: Subject to any disclaimer, the term of this patent is extended or adjusted under 35 U.S.C. 154(b) by 214 days.

(21) Appl. No.: 12/493,073

(22) Filed: Jun. 26, 2009

(65) Prior Publication Data

US 2010/0183039 A1     Jul. 22, 2010

Related U.S. Application Data

(60) Provisional application No. 61/146,113, filed on Jan. 21, 2009.

(51) Int. Cl.
*H01S 5/024* (2006.01)
*H01S 5/40* (2006.01)

(52) U.S. Cl. ..... 372/36; 372/34; 372/50.12; 372/50.121

(58) Field of Classification Search ............ 372/36, 372/50.12, 50.121, 34
See application file for complete search history.

(56) References Cited

U.S. PATENT DOCUMENTS

| | | | |
|---|---|---|---|
| 4,901,330 A * | 2/1990 | Wolfram et al. ............ 372/75 |
| 5,040,187 A | 8/1991 | Karpinski | |
| 5,099,488 A | 3/1992 | Ahrabi et al. | |
| 5,105,429 A | 4/1992 | Mundinger et al. | |
| 5,394,426 A | 2/1995 | Joslin | |
| 5,835,515 A | 11/1998 | Huang | |
| 5,835,518 A | 11/1998 | Mundinger et al. | |
| 5,909,458 A | 6/1999 | Freitas et al. | |
| 5,930,030 A | 7/1999 | Scifres | |
| 6,151,342 A | 11/2000 | Nightingale et al. | |
| 6,229,831 B1 | 5/2001 | Nightingale et al. | |
| 6,352,873 B1 | 3/2002 | Hoden | |
| 6,975,294 B2 * | 12/2005 | Manni et al. ............ 345/83 |
| 6,993,059 B2 | 1/2006 | Anikitchev et al. | |
| 7,006,549 B2 | 2/2006 | Anikitchev et al. | |
| 7,060,515 B2 | 6/2006 | Stephens | |
| 2008/0089371 A1 * | 4/2008 | Reichert ............ 372/34 |

\* cited by examiner

*Primary Examiner* — Jessica Stultz
*Assistant Examiner* — Michael Carter
(74) *Attorney, Agent, or Firm* — Morrison & Foerster LLP

(57) ABSTRACT

It is demonstrated that substantial operating-parameter-dependent temperature-differences can exist between diode-laser bars in pulsed operation of a stack of such bars arranged to provide a two-dimensional array of diode-laser emitters. These differences can produce distortion of the aggregate output spectrum of the stack. By selecting particular nominal emitting wavelengths of the diode-laser bars for specific positions in the stack, the aggregate emission-spectrum can be tailored to a desired shape for one or more sets of operating parameters of the stack.

8 Claims, 4 Drawing Sheets

TWO-DIMENSIONAL DIODE-LASER ARRAY WITH BROAD-BAND OUTPUT

PRIORITY

This application claims priority to U.S. Provisional Application Ser. No. 61/146,113, filed Jan. 21, 2009.

TECHNICAL FIELD OF THE INVENTION

The present invention relates in general to arrays of electrically pumped, edge-emitting semiconductor lasers (diode-lasers). The invention relates in particular to two-dimensional arrays of diode-lasers.

DISCUSSION OF BACKGROUND ART

Diode-lasers and arrays of diode-lasers are now almost universally used for optically pumping bulk solid-state lasers and fiber-lasers. In many optical pumping arrangements, the diode-lasers are operated in a continuous-wave (CW) mode. The laser being pumped can be operated in a CW pumped mode or can be operated in a pulsed mode by mode-locking or Q-switching the solid-state laser. It is also possible to operate a diode-laser pumped solid-state laser or fiber-laser in a pulsed mode by operating the diode-laser in a pulsed mode. This, however, is usually only practical for low pump-powers because of power-supply availability.

The overall (electrical to optical) conversion efficiency of a diode-laser can be about 50% or greater. A portion of the residual inefficiency manifests itself as resistive heating.

In a one-dimensional array of diode-lasers, typically referred to as a diode-laser bar, the individual lasers (emitters) are aligned in the slow-axis direction. Generally the more emitters there are, the more total power is emitted, however, the less is the overall brightness of the output. Emitters of the diode-laser bar are formed in epitaxially-grown semiconductor layers on a single crystal semiconductor substrate. The diode-laser bar is typically mounted epitaxial-side down on a heat-sink.

The brightness of an individual diode-laser output in an axis (the fast-axis) perpendicular to the slow-axis is much brighter than that in the slow-axis. In two-dimensional arrays of diode-laser bars diode-laser bars are arranged one above the other in the fast-axis direction. While this provides for more power than would be available with any one of the bars without significant decrease in brightness, the total fast-axis brightness is limited by the distance that is provided between the diode-laser bars. Usually, space is provided for at least a sub-mount to provide some individual cooling and to thermally separate the diode-laser bars for limiting temperature rise due to resistive heating. Sub-mount-separated diode-laser bars in a two-dimensional array thereof are usually separated by about 400 micrometers ($\mu$m).

It has been recognized in the prior-art that if a two-dimensional diode-laser array is to be operated in a pulsed-mode, with relatively low power pulses at relatively low pulse-repetition rate (PRF), for example less than about 100 Hz with a duty cycle of about 1%, the resistive heating of the array will be sufficiently low that diode-laser bars in the array can be directly stacked one-on-another, with a cooling member on the "top" and on the "bottom" of the stack, but without any intervening cooling members. Such an arrangement is described in U.S. Pat. No. 5,394,426, and also in U.S. Pre-grant Publication No. 2008/0089371, the disclosures of which are incorporated herein by reference.

Such stacking reduces the spacing (pitch) of the diode-laser bars in the fast axis essentially to the thickness of the substrate on which a bar is grown. This thickness is typically on the order of about 150 $\mu$m for a substrate thinned from a commercially available semiconductor wafer. Nevertheless, this provides at least a three fold increase in brightness compared with a stack wherein each bar is individually cooled. It has been observed, however, that, even at a duty cycle of only 1%, the aggregate output spectrum of a directly-bonded stack is significantly broadened and distorted compared with the spectrum of a single diode-laser bar.

In many applications, the shape of the output spectrum of the stack can be as important as the brightness of the output. Accordingly it would be advantageous to control the shape of the output spectrum of a stack of diode-laser bars to maximize the advantage of the higher brightness.

SUMMARY OF THE INVENTION

In one aspect apparatus in accordance with the present invention comprises a stack of diode-laser bars each thereof having a fast-axis, a slow-axis, a nominal emission-wavelength and an emission-bandwidth. The diode-laser bars are arranged one-above the other in the fast-axis direction and electrically connected such that all can be simultaneously driven in a pulsed manner at a selected peak pulse-power, pulse-duration, and pulse-repetition frequency. The nominal emission wavelength of each of the diode laser bars and the position of the bar in the stack is arranged such that the aggregate-emission spectrum of the stack of diode-laser bars has a predetermined bandwidth and maximum modulation depth at the selected peak pulse-power, pulse-duration, and pulse-repetition frequency.

In one example of the apparatus there are six diode-laser bars bonded directly one to another in thermal and electrical contact. There is a thermally massive end cap at the top of the stack and the bottom of the stack. The nominal emission wavelength of each of the diode-laser bars and the position of the bar in the stack is arranged such that at a peak-power of 200 Watts per bar and a pulse duration of about 250 microseconds the aggregate-emission spectrum of the stack of diode-laser bars has a center wavelength between about 807 nm and about 809 nm and a bandwidth of about 10 nanometers for pulse-repetition frequencies between about 2 Hertz and about 40 Hertz.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
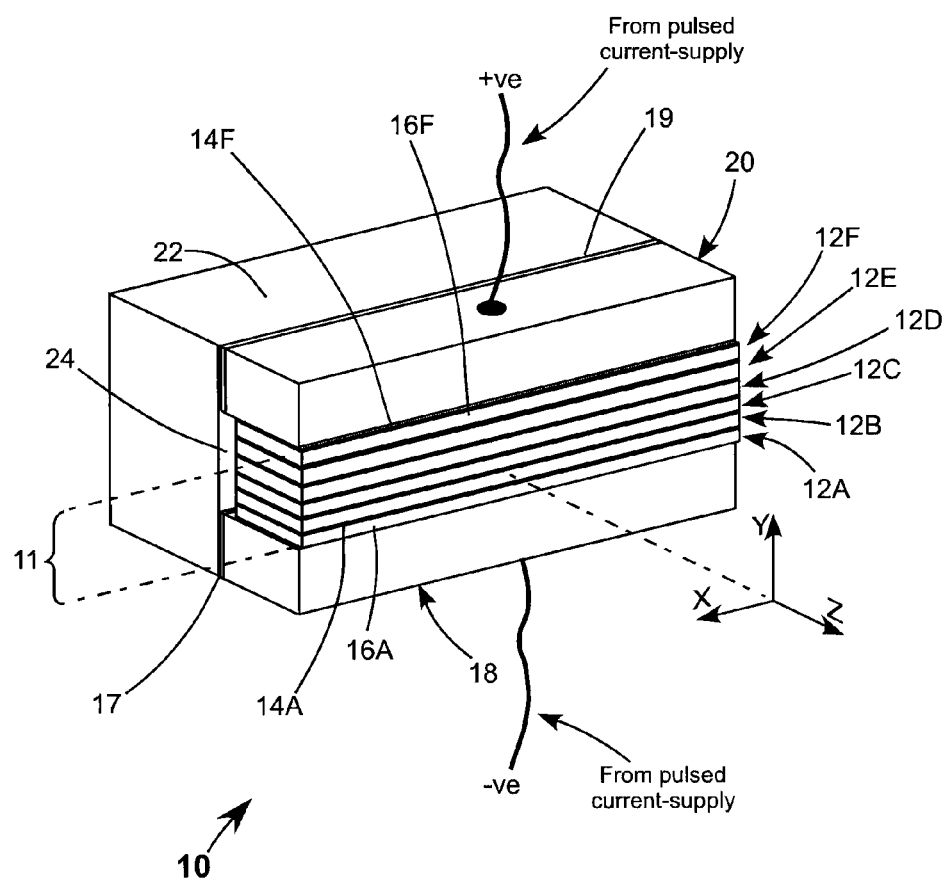
FIG. 1 is a three-dimensional view schematically illustrating a preferred embodiment of a conduction-cooled stack of diode-laser bars in accordance with the present invention, including six diode-laser bars each thereof having an epitaxial layer structure grown on a substrate, the bars being directly bonded one on the other and held between two heat-sink members attached to a common base.

Referring now to the drawings, wherein like components are designated by like reference numerals, FIG. 1 schematically illustrates a preferred embodiment 10 of diode-laser apparatus in accordance with the present invention. Apparatus 10 includes a stack 11 of six diode-laser bars 12A, 12B, 12C, 12D, 12E, and 12F. Each bar includes a heterostructure 14 grown on a substrate 16. Diode-laser emitters (not shown) are designated within the heterostructure as is known in the art. There can be any number of emitters in a bar depending on the length of the bar, the width of the emitters, and the distance between the emitters. The emitters have a width, in what is referred to as the slow-axis, and a height, in what is referred to as the fast-axis. Light is emitted generally along a propagation-axis. The fast-axis, slow-axis, and propagation-axis are indicated in FIG. 1 by axes Y, X, and Z, respectively. A diode-laser bar can be characterized as having a "fill-factor" which is essentially the total of the emitter widths as a percentage of the distance between end-ones of the emitters.

Preferably, each bar in the stack has the same number of emitters of the same width and fill-factor. The bars can then be conveniently soldered one to the next, with the epitaxial side of one bar soldered to the substrate side of an adjacent bar such that the emitters are connected in series-parallel.

Stack 11 is sandwiched between a heat-sink member 18 and a heat-sink member 20, with both heat-sink members being supported on a base 22. There is a space 24 between the stack and the base. The epitaxial side 14F of bar 12F is in thermal contact with heat-sink member 20. The substrate side 16A of bar 12A is in thermal contact with heat-sink member 18. The diode-laser bars are in thermal contact with each other, with the epitaxial side of one in thermal contact with the substrate side of the next except of bar 12F. Heat-sink members 18 and 20 are insulated from base 22 by insulating layers 17 and 19 respectively. Current from a pulsed power supply for driving the stack is connected to the stack by attaching a positive lead to heat-sink member 20 and a negative lead to heat-sink member 18.

Diode-laser bars are typically cut from a substrate wafer on which a heterostructure is grown. The bars are cut from the wafer and conductive stripes are applied to the bars to define the emitters. The heterostructure is designed to provide emitters having a desired emission-wavelength. As manufacturing controls are not perfect, there is usually some variation of emitter wavelength between bars. This is typically on the order of about plus or minus 1.0 to 1.5 nanometers of some nominal wavelength.

The arrangement of apparatus 10 is similar to above-discussed prior-art apparatus including directly bonded stacks of diode-laser bars. The apparatus differs however in the manner in which the diode-laser bars are selected for stack 11.

In prior-art arrangements, the diode-laser bars were selected randomly from a batch having nominally the same wavelength and presumably subject randomly to the above discussed spread of values due to manufacturing tolerances. It was observed during testing of such a prior-art stack that the aggregate emission-wavelength and spectral bandwidth (full width at half-maximum or FWHM) differed significantly with different operating parameters of the stack even at less than the 1% duty cycle that had been thought to be low enough to essentially exclude thermal effects.

An investigation revealed that these differences were due to a substantial difference in the transient temperatures of the bars during application of a current pulse to provide an output pulse of the stack. Conclusions of this investigation are set forth below. Beginning with reference to FIG. 2

Figure 2:
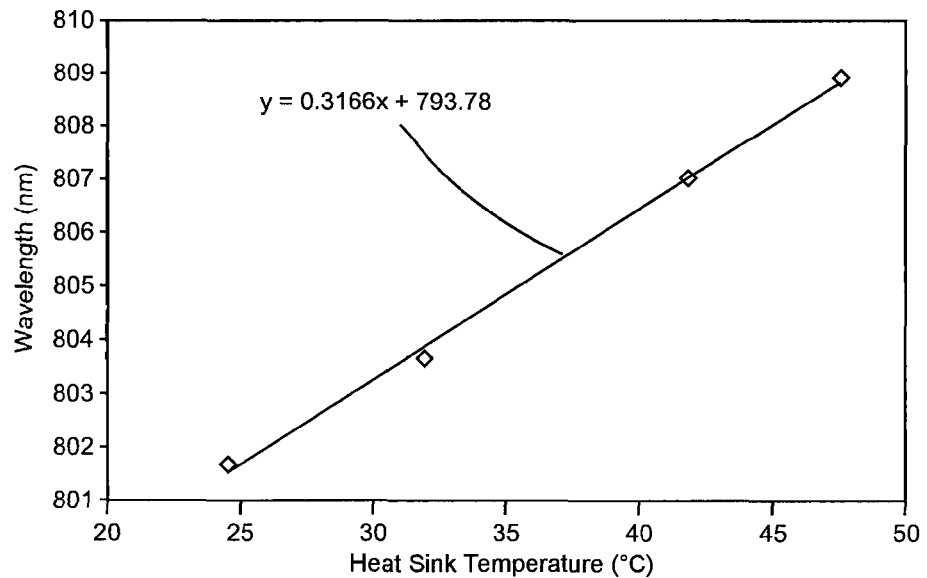
FIG. 2 is a graph schematically illustrating a linear, emission-wavelength versus heat-sink temperature curve, fit to measured temperature/wavelength data points, for a prior-art diode-laser bar stack similar to the stack of FIG. 1.

FIG. 2 is a graph schematically depicting measured vales (designated by open diamonds) of the emission-wavelength of a prior-art diode-laser stack as a function of the temperature of a heat-sink supporting the diode-laser bar. A linear fit was made to the measured data resulting in an equation:

$$y = 0.3166x + 793.78 \qquad (1)$$

where y is the center emission-wavelength in nanometers (nm) and x is the temperature in ° C. This relationship is used in further calculations discussed hereinbelow.

Figure 3:
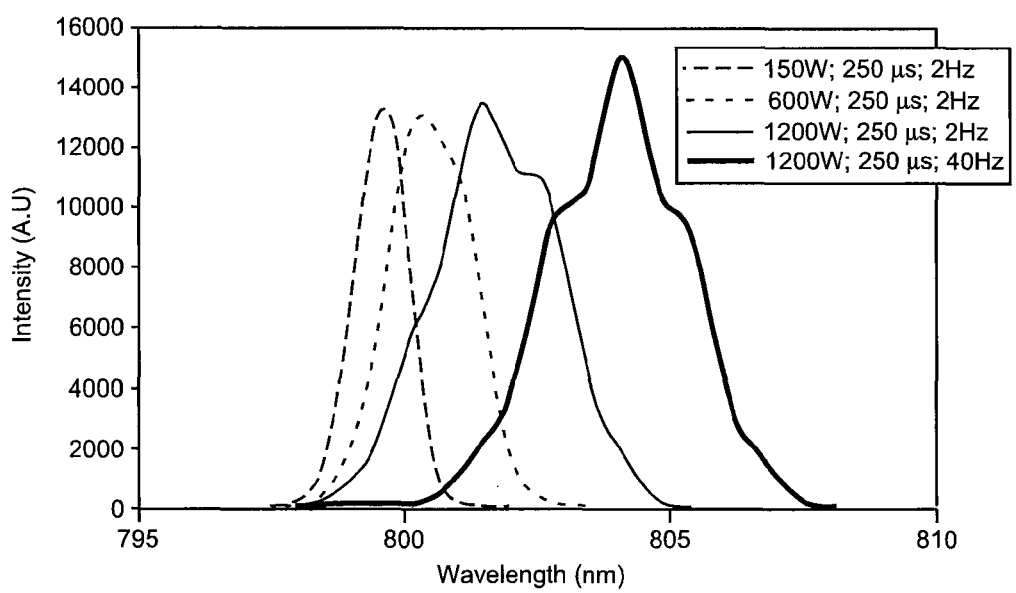
FIG. 3 schematically illustrates the computed emission-spectrum as a function of operating parameters for the stack of FIG. 1 in a prior-art arrangement wherein the individual diode-bars each have nominally the same emission-spectrum as a function of temperature.

FIG. 3 is a graph schematically indication the measure aggregate emission-spectrum of the prior-art six-bar stack as a function of various operating parameters of the stack. The pulse duration is the same in each set of parameters with variables being the peak power of the pulse and the pulse-repetition frequency (PRF). The pulse duration of 250 μs corresponds to about the excited-state lifetime of neodymium-doped YAG which is material that than can be optically pumped by radiation from such a stack.

It can be seen that at a PRF of 2 Hz, increasing pulse power causes the aggregate center wavelength of the output spectrum to shift to longer wavelengths, with increasing FHWM. At 1200 W power (200 W per bar), and a PRF of 40 Hz the center wavelength is shifted still further and the bandwidth is further increased. Note that 250 μs at 40 Hz represents a duty cycle of only 1%, but this has doubled the bandwidth compared with the relatively benign condition of 100 ms at 2 Hz, for which it can be seen that the emission-spectrum is about the same as that of an individual emitter.

Figure 4:
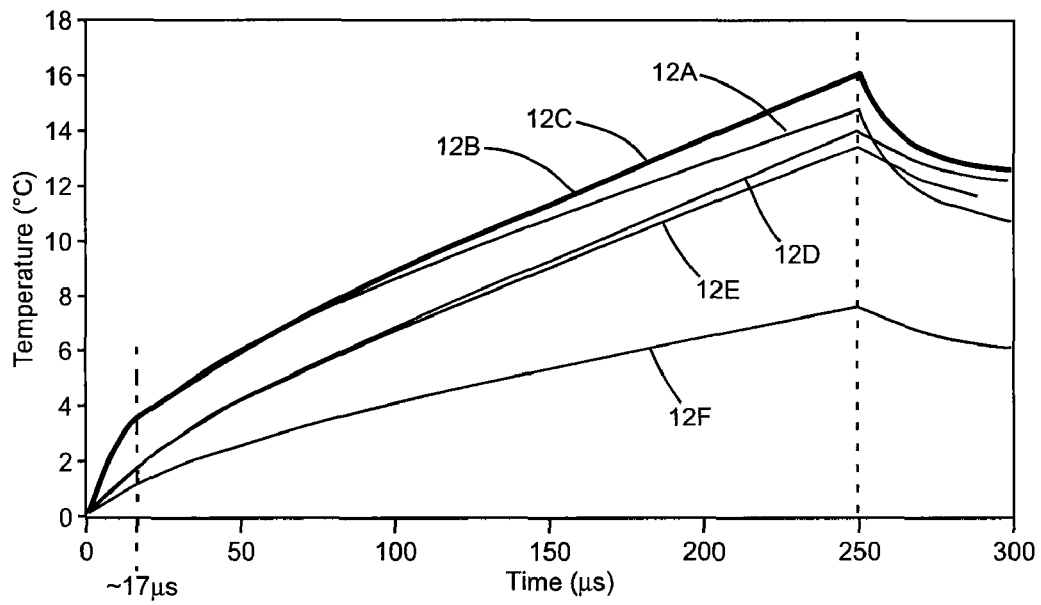
FIG. 4 is a graph schematically illustrating computed temperature as a function of time for the epitaxial-layer sides individual bars in a stack similar to the stack of FIG. 1.

FIG. 4 is a graph schematically illustrating calculated temperature as a function of time, during a 250 μs pulse, for the epitaxial sides of the diode-laser bars of the example of stack 11 that yielded the result of FIG. 3. It is assumed in FIG. 4 that the power is 200 W per bar. Not surprisingly, the lowest temperature is recorded for bar 12F, the epitaxial side of which is in direct thermal contact with the heat-sink member 20. The hottest bars are bars 12B and 12C, the epitaxial sides of which are furthest from a heat-sink member. The gradually increasing temperature difference can be referred to whimsically as "thermal chirp".

The curves of FIG. 4 certainly indicate that the prior-art assumption that the temperature rise at short pulse-lengths and low duty cycle is relatively small, and is easily limited by a passive conductive cooling arrangement. The curves also indicate, however, that the temperature differences of bars in the stack are significant, and are the cause of the thermal distortion of the aggregate output spectrum exemplified in FIG. 3.

It should be noted here that the calculation of the curves of FIG. 4 assumes that the diode-laser bars have 60 emitters about 150 μm wide, at a fill factor of about 90% and that all emitters in a bar emit at the same wavelength, and with same spectrum, at any given temperature. This a reasonable assumption given the ratio of the length of the bars to the separation of the epitaxial sides of the bars, and given that the conductive cooling path is essentially direct and linear between cooling members 18 and 20.

Figure 5:
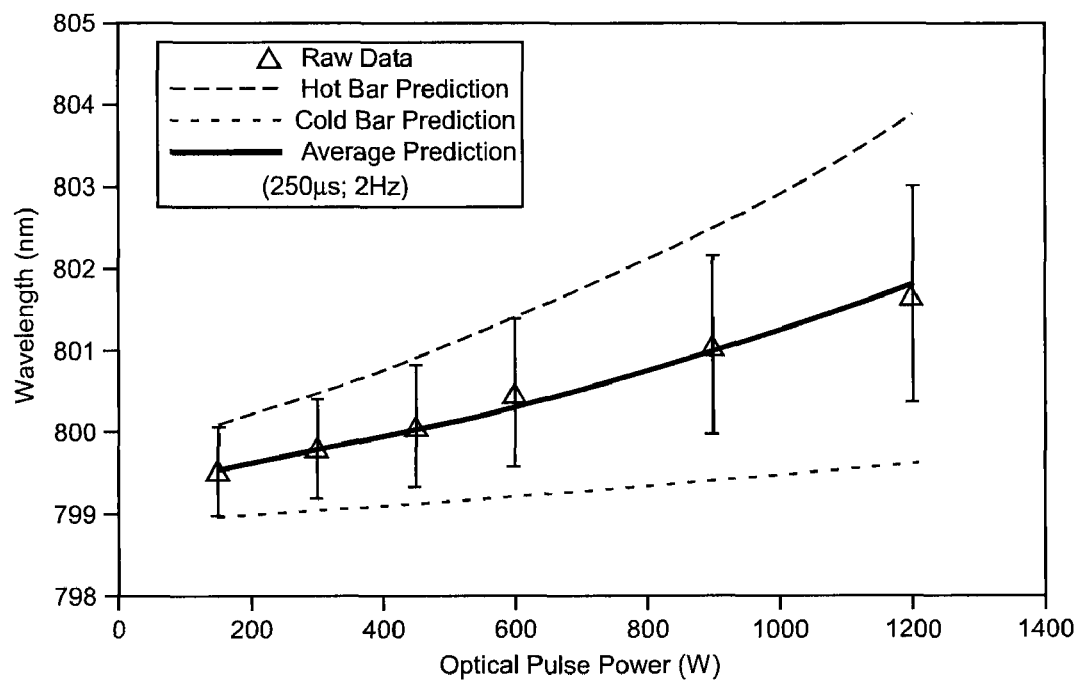
FIG. 5 is a graph schematically illustrating the computed emission-wavelength of the hottest and coldest bars in the graph of FIG. 4 as a function of optical pulse power compared with measured values of aggregate emission-wavelength and full width at half maximum of a stack of bars having nominally the same emission-wavelength as used in the prior.

FIG. 5 is a graph schematically illustrating, as a function of pulse power, the computed wavelength for the hottest and coldest bar in the stack 11 and the average wavelength of all bars. The computed average values are compared with measured values (open triangles) of the average wavelength. The vertical bars through the triangles represent the measured full width at half maximum of the spectrum. Transient temperature variations between bars cause wavelength shifts much greater than the difference between emission-wavelengths of bars due to manufacturing tolerances, i.e., random selection from a batch.

Figure 6:
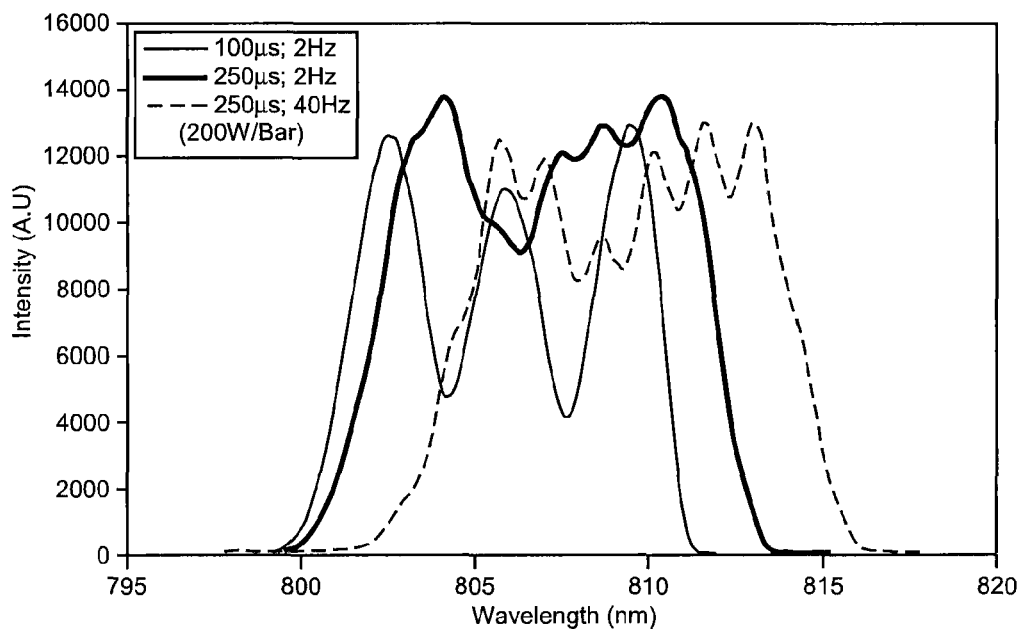
FIG. 6 is a graph schematically illustrating, for various sets of operating parameters, the computed aggregate emission-spectrum of a stack of diode-laser bars in accordance with the present invention wherein the nominal emission-wavelength of bars in the stack is selected according to the position of the bars in the stack such that the emission-bandwidth is substantially independent of operating parameters of the stack.

FIG. 6 is a graph schematically illustrating measure spectra of the aggregate output of a stack 12 in which the normal emission-wavelength of each diode-laser bar is selected in accordance with the position of the bar in the stack to provide a broad-band output spectrum at a range of operation parameters of the stack. A broad band spectrum would be useful in optically pumping a specific narrow absorption line of a solid-state gain medium without any wavelength control provision for the stack. The nominal emission-wavelengths of bars 12A, 12B, 12C, 12D, 12E, and 12F are 801.71 nm, 808.10 nm, 804.49 nm, 808.10 nm, 804.43 nm, and 801.05 nm, respectively.

Under relatively benign conditions of 100 μs pulse length at a PRF of 2 Hz, the spectrum has a bandwidth of about 9.5 nm but is deeply modulated at about 65% due to the spread of the nominal emission-wavelengths of the bars individual bars. At 250 μs and 2 Hz PRF, the aggregate emission-spectrum has a width of about 10.0 nm and a relatively low modulation depth less than about 35%. Increasing the PRF to 40 Hz shifts the average (center) wavelength by about 2 nm, from about 807 nm to about 809 nm, while maintaining the bandwidth at about 10.0 nm and maintaining the relatively low modulation depth. This indicates that the spectral shape is relatively frequency insensitive with only the center wavelength varying with frequency. In this example the bandwidth of 10 nm is about 8 times the emission bandwidth of any one of the diode-laser bars. Different results can be expected for stacks having more or less than 6 diode-bars therein.

This broad bandwidth is ideally suited to pumping gain media of neodymium doped-host materials that have a pump radiation bandwidth of about 1 nm without a closed loop thermal wavelength control arrangement. The 10 nm bandwidth is sufficiently broad such that an overall temperature excursion of about ±10° C. about a nominal ambient temperature can be tolerated while still retaining the absorption band of the gain-medium within the emission bandwidth of the diode-laser bar stack.

In addition to being able to configure a diode-laser bar stack to provide a broad band output at a specific sets of parameters as described above with reference to FIG. 6, it is also possible to configure a stack to have an aggregate output at a specific set of operating parameters that has essentially the same spectral shape as a single diode-laser bar. This would be important in a case where it was desired to have all available output absorbed in a narrow band absorption region.

Figure 7:
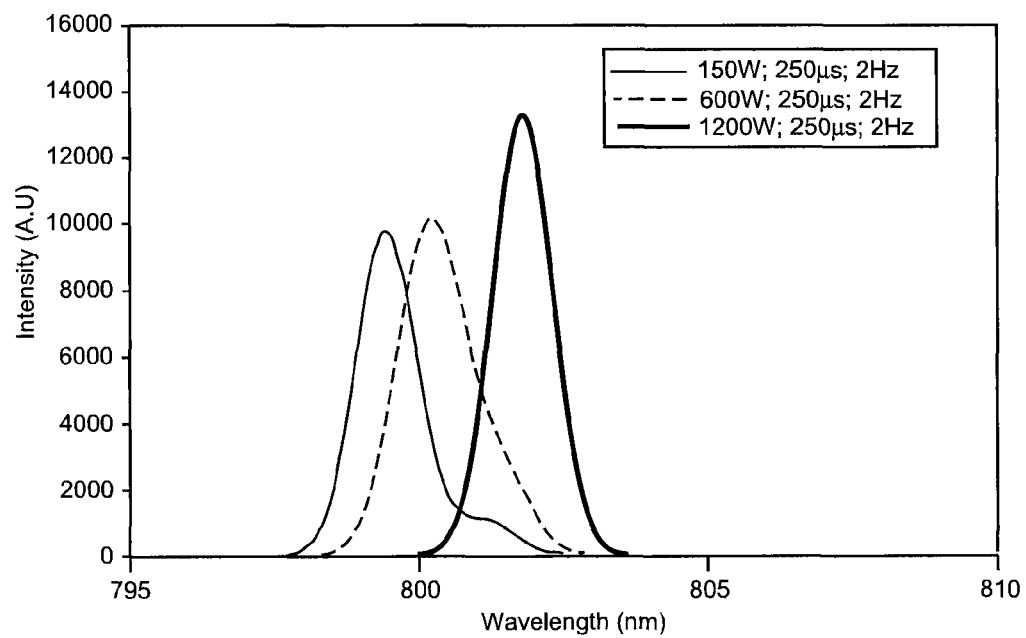
FIG. 7 is a graph schematically illustrating, for various sets of operating parameters, the computed aggregate emission-spectrum of a stack of diode-laser bars in accordance with the present invention wherein the nominal emission-wavelength of bars in the stack is selected such that for one selected set of operating parameters the computed aggregate emission-spectrum is about the same as that of an individual diode-laser bar.

FIG. 7 is a graph schematically depicting the calculated spectrum as a function of operating parameters for a six-bar, diode-laser bar stack similar to stack 11, wherein the nominal wavelengths of bars 12A, 12B, 12C, 12D, 12E, and 12F are assumed to be 799.64 nm, 799.14 nm, 799.14 nm, 799.79 nm, 799.79 nm, and 799.96 nm, respectively. It can be seen that at the relatively benign condition of 150 W; 250 μs; and 2 Hz, the spectrum is skewed to a long "tail" at longer wavelengths. The nominal wavelengths of the bars is selected such that thermally shifted wavelengths at parameters the 1200 W; 250 μs; and 2 Hz essentially exactly overlap at a wavelength of about 801.8 nm such that the aggregate relative spectral distribution of intensity (spectral shape and emission bandwidth) is the same as that of a single diode-laser bar. The calculations of FIG. 7 were made using form equations and data from the graphs of FIGS. 2 and 4.

In summary, it has been determined that substantial operating-parameter-dependent temperature-differences can exist between diode-laser bars in pulsed operation of a stack thereof providing a two-dimensional array of diode-laser emitters. These differences can produce distortion of the aggregate emission-spectrum of the stack. By selecting particular nominal emission-wavelengths of the diode-laser bars for specific positions in the stack, the aggregate emission-spectrum can be tailored to a desired shape for one or more sets of operating parameters of the stack. While examples presented above are for a stack of 6 diode-lasers bars directly bonded one on the other with 150 μm pitch, principles of the present invention are applicable to stacks having different numbers of bars, directly bonded or sub-mount spaced, with different spacing therebetween.

In one above-described embodiment of the present invention, the aggregate emission-spectrum of a stack of six directly bonded bars is tailored to have a broad bandwidth which is relatively constant for different sets of operating parameters. In another above-described embodiment of the present invention, the aggregate emission-spectrum of a stack of six directly bonded bars is tailored to have a spectral shape similar to that of a single diode-laser bar for a specific set of operating parameters.

The present invention is not limited, however, to embodiments described and depicted. Rather, the invention is limited only by the claims appended hereto.

What is claimed is:

1. An improved method of fabricating a diode laser array, said array comprising a stack of at least three diode laser bars each thereof having a fast axis and a slow axis, the diode laser bars being directly bonded to each other one above the other in the fast axis direction, said array further including first and second cooling members in thermal contact with the diode laser bar stack at respectively the top and bottom thereof, said method comprises the steps of:

determining the nominal emission wavelength of a plurality of diode laser bars; and:

selecting particular nominal emission wavelength bars and positioning the selected bars in a particular order in the stack, said order being based on (a) the determined nominal emission wavelength of the bars and (b) the location of the bars with respect to the cooling members in order to tailor the shape of the aggregate emission spectrum and minimize the affects of temperature variations during operation.

2. A method as recited in claim 1 wherein the selection and positioning of the bars is arranged so that the aggregate emission spectrum is eight times the emission bandwidth of any one of the diode-laser bars and the maximum modulation depth is about 35%.

3. The method of claim 1 wherein the selection and positioning of the bars is arranged so that the aggregate emission-spectrum has a bandwidth of about 10 nanometers.

4. The method of claim 3 wherein the selection and positioning of the bars is arranged so that the aggregate emission-spectrum has a center wavelength between about 807 nm and about 809 nm.

5. The method of claim 3 wherein the stack includes at least five bars.

6. The method of claim 3 wherein the stack includes six bars.

7. The method of claim 3 further including a common heat sink in contact with the first and second cooling members.

8. The method of claim 1 wherein the variation in nominal wavelength of the bars going in order from the first to the second cooling member does not continuously increase or continuously decrease.

* * * * *